(12) United States Patent
Cowles et al.

(10) Patent No.: US 7,320,174 B2
(45) Date of Patent: Jan. 22, 2008

(54) METHODS FOR CREATING GROUND PATHS FOR ILS

(75) Inventors: Kevin Cowles, Fargo, ND (US); A. David Erpelding, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/735,254

(22) Filed: Dec. 12, 2003

(65) Prior Publication Data

US 2004/0187296 A1 Sep. 30, 2004

Related U.S. Application Data

(62) Division of application No. 09/561,821, filed on Apr. 28, 2000, now Pat. No. 6,700,748.

(51) Int. Cl.
*H01K 3/10* (2006.01)
(52) U.S. Cl. .................. 29/852; 29/603.15; 29/603.16; 29/831; 29/842; 29/860; 29/885; 360/122; 360/126; 360/317; 216/65; 427/127; 427/128
(58) Field of Classification Search .......... 29/603.07, 29/603.15, 603.16, 603.18, 831, 840, 842, 29/846, 852, 854, 860, 885; 360/122–126, 360/31; 427/127, 128; 216/65
See application file for complete search history.

(56) References Cited

U.S. PATENT DOCUMENTS 5,986,853 A * 11/1999 Simmons et al. ........ 360/245.9

| | | | |
|---|---|---|---|
| 6,052,258 A * | 4/2000 | Albrecht et al. ......... | 360/245.2 |
| 6,285,086 B1 * | 9/2001 | Sota et al. .................. | 257/786 |
| 6,429,113 B1 * | 8/2002 | Lewis et al. ................ | 438/612 |
| 6,565,730 B2 * | 5/2003 | Chakravorty et al. ....... | 205/122 |

FOREIGN PATENT DOCUMENTS

JP 58223355 A * 12/1983

OTHER PUBLICATIONS

"Effect of air-bearing design on slider dynamics during unloading process"; Tanaka, H.; Kohira, H.; Matsumoto, M.; Magnetics, IEEE Transactions on vol. 37; Jul. 2001; pp. 1818-1820.*

* cited by examiner

*Primary Examiner*—Paul D. Kim
(74) *Attorney, Agent, or Firm*—Zilka-Kotab, PC

(57) ABSTRACT

Methods for creating a ground path between a stainless steel suspension and a copper trace layer in an integrated lead assembly of a disk drive suspension. The invention prevents electrostatic discharge (ESD) damage by providing a means for grounding a lead to a controlled ground potential. Although the lead and suspension are generally separated by an insulating layer such as a polymide layer, connection between the lead and suspension can be made by, for example, creating an opening in the insulation layer and depositing a conductive material such an electrically conductive glue, solder or some other material through the opening to connect the two electrically conductive layers. A rivet may also be used to connect the two electrically conductive layers through a through hole that extends through both electrically conductive layers and the electrically insulating layer.

21 Claims, 8 Drawing Sheets

GROUNDING VIA Fig.2A

PLATED SOLDER Fig.2B

SCREEN SOLDER Fig.2C

REFLOW SOLDER Fig.2D

METHODS FOR CREATING GROUND PATHS FOR ILS

RELATED APPLICATIONS

This application is a divisional of U.S. patent application Ser. No. 09/561,821, filed Apr. 28, 2000 now U.S. Pat. No. 6,700,748.

FIELD OF THE INVENTION

The present invention relates to electrical grounding circuitry for magnetic disk drives and more particularly to grounding schemes designed to protect against electrostatic discharge (ESD) and electrical overstress (EOS), and to reduce background noises in read/write transducers utilizing magnetoresistive read sensors.

DESCRIPTION OF THE RELATED ART

Magnetic head disk drive systems have been widely accepted in the computer industry as a cost-effective form of data storage. In a magnetic disk drive system, a magnetic recording medium in the form of a disk rotates at high speed while a magnetic read/write transducer, referred to as a magnetic head, "flies" slightly above the surface of the rotating disk. The magnetic disk is rotated by means of a spindle drive motor. The magnetic head is attached to or formed integrally with a "slider" which is suspended over the disk on a spring-loaded support arm known as the actuator arm. As the magnetic disk rotates at operating speed, the moving air generated by the rotating disk in conjunction with the physical design of the slider lifts the magnetic head, allowing it to glide or "fly" slightly above and over the disk surface on a cushion of air, referred to as an air bearing. The flying height of the magnetic head over the disk surface is typically only a few tens of nanometers or less and is primarily a function of disk rotation, the aerodynamic properties of the slider assembly and the force exerted by the spring-loaded actuator arm.

A major problem that is encountered during manufacture, handling and use of magnetic recording transducers, referred to as heads, is the buildup of electrostatic charges on the various elements of a head or other objects which come into contact with the heads, particular heads of the thin film type, and the accompanying spurious discharge of the static electricity thus generated. Static charges may be produced for example by the presence of certain materials, such as plastics, during manufacture and subsequent handling of the heads. These static charges arc across the edge of the insulating layer between the magnetic pole tips and adjacent conductive layers which are exposed and positioned adjacent to the transducing gap at the air bearing surface facing the recording medium thus causing erosion of the pole tips and degradation of the transducer in reading and writing of data.

As described above, when an MR sensor is exposed to ESD, or even a voltage or current input larger than that intended under normal operating conditions, referred to as electrical overstress or EOS, the MR sensor and other parts of the head may be damaged. This sensitivity to electrical damage is particularly severe for MR read sensors because of their relatively small physical size. For example, an MR sensor used for extremely high recording densities will have a cross-section of 100 Angstroms (.ANG.) by 1.0 micrometers (um) or smaller. Discharge of voltages of only a few volts through such a physically small sensor, behaving like a resistor, is sufficient to produce currents capable of severely damaging or completely destroying the MR sensor. The nature of the damage which may be experienced by an MR sensor varies significantly, including complete destruction of the sensor via melting and evaporation, contamination of the air bearing surface, generation of shorts via electrical breakdown, and milder forms of damage in which the head performance may be degraded.

Magnetoresistive sensors, also referred to as "MR heads," are particularly useful as read elements in magnetic transducers, especially at high data recording densities. The MR sensor provides a higher output signal than an inductive read head. This higher output signal results in a higher signal-to-noise ratio for the recording channel and allows higher areal density of recorded data on a magnetic disk surface.

Another method to increase the signal-to-noise ratio and therefore the areal density of recorded data on a magnetic disk surface is to decrease the noise. Noise is introduced into the MR head readings by the MR head and slider picking up undesirable external voltage/EMF fluctuations during operation of the disk drive. The noise can be reduced if the MR head and slider is properly grounded.

Kudo et al. U.S. Pat. No. 5,657,186 discloses a method of electrically connecting a slider to a grounding pad via a conductive resin.

A need therefore exists for providing a layer assembly that can be grounded to a desired potential.

SUMMARY OF THE INVENTION

A principle objective of the present invention is to provide a method to ground the stainless steel layer of an Integrated Lead Suspension (ILS) to a controlled ground—potential.

In view of the foregoing objects, the present invention provides several methods to bring the stainless steel layer into contact with the copper layer through a layer of dielectric material. The first of these methods consist of creating a via from the copper layer, through the dielectric layer and onto the stainless steel layer exposing the surface of the stainless steel layer through the via. Conductive adhesive is then used to fill the via, creating a ground path between the stainless steel layer and the copper layer. The same can be done from the stainless steel to the copper layer. Instead of opening the via from copper layer to stainless steel layer, the via is opened from the stainless steel layer to the surface of the copper layer through the dielectric layer.

Instead of using conductive adhesive glue, solder can be used to create a grounding path between the copper layer and the stainless steel layer.

An alternative method calls for the recess of the copper layer layer and the dielectric layer, exposing the stainless steel layer. Solder is applied to the edge of this recess that overhangs the stainless steel and makes contact between the copper layer and the stainless steel layer.

A rivet can also be used to make contact between the copper layer and the stainless steel layer. A through hole is created through all three layers and a rivet attached that clamps down on the copper layer and the stainless steel layer.

A copper finger can also be used to make contact between the copper layer and the stainless steel layer. This method entails etching a copper finger which is connected to the copper layer. This copper finger is then pressed into contact with the stainless steel layer and welded in place.

The copper finger can also be sandwiched between the mount plate and the arm at the swage or between the mount plate and load beam at the layer weld process.

An alternative embodiment would be to create a via through the stainless steel layer and the dielectric layer to the surface of the copper layer. A dimple is then created on the load beam and during the assembly process, the load beam is pressed on top of the stainless steel layer and the dimple on the load beam is placed in the via. The dimple will make contact with the copper layer creating a ground path from the copper layer to the stainless steel layer.

Another embodiment is to punch a through hole through all three layers. By punching a through hole, the stainless steel will smear through the dielectric layer and make contact with the copper layer. Alternatively, the through hole can be punched through the copper layer to the stainless steel layer and in this case, the copper will smear through the dielectric layer and make contact with the stainless steel layer.

BRIEF DESCRIPTION OF THE DRAWINGS

The foregoing and other objects, features and advantages of the present invention will be apparent from the following detailed description of the preferred embodiments of the invention, reference being made to the accompanying drawing, in which like reference numerals indicate like parts and in which:

FIGS. 2a-2e are illustrations showing the first embodiment of the present invention;

DETAILED DESCRIPTION OF THE EMBODIMENTS

Figure 1C:
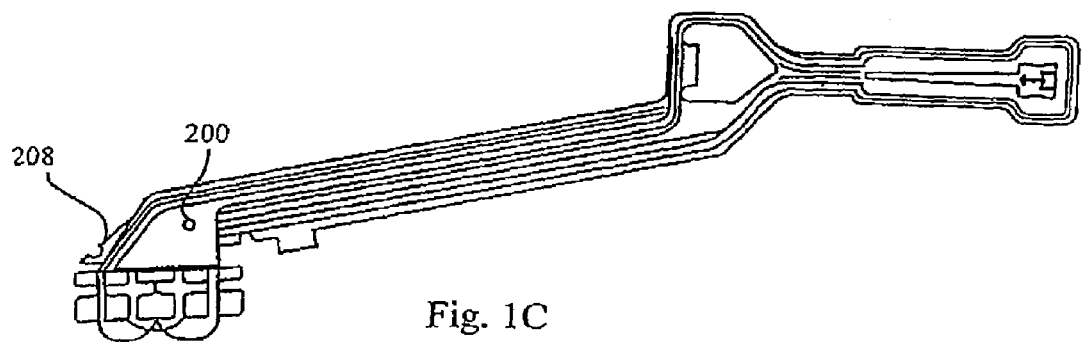
FIGS. 1A-1D are illustrations showing a first embodiment of the present invention.
Figure 1B:
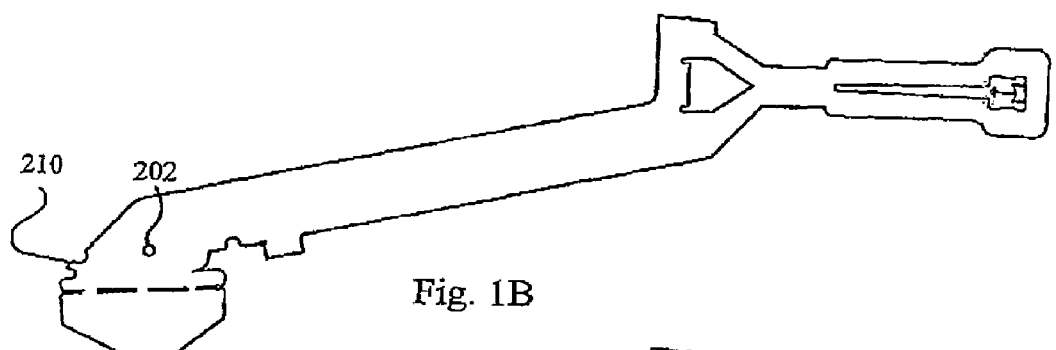
Figure 1A:
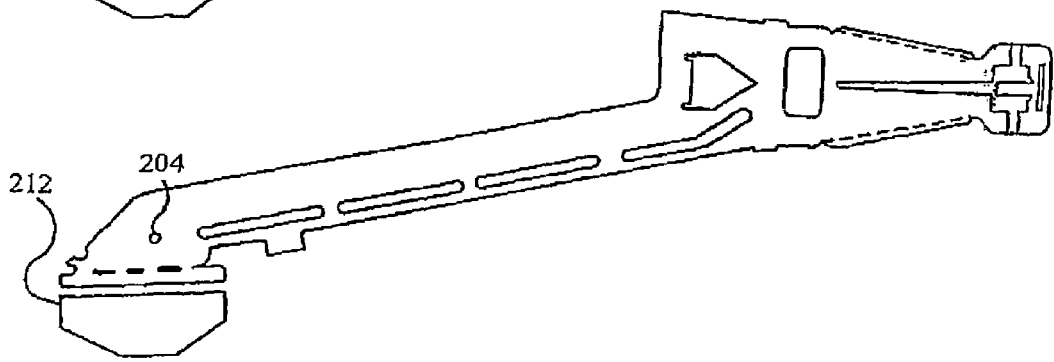
Figure 1D:
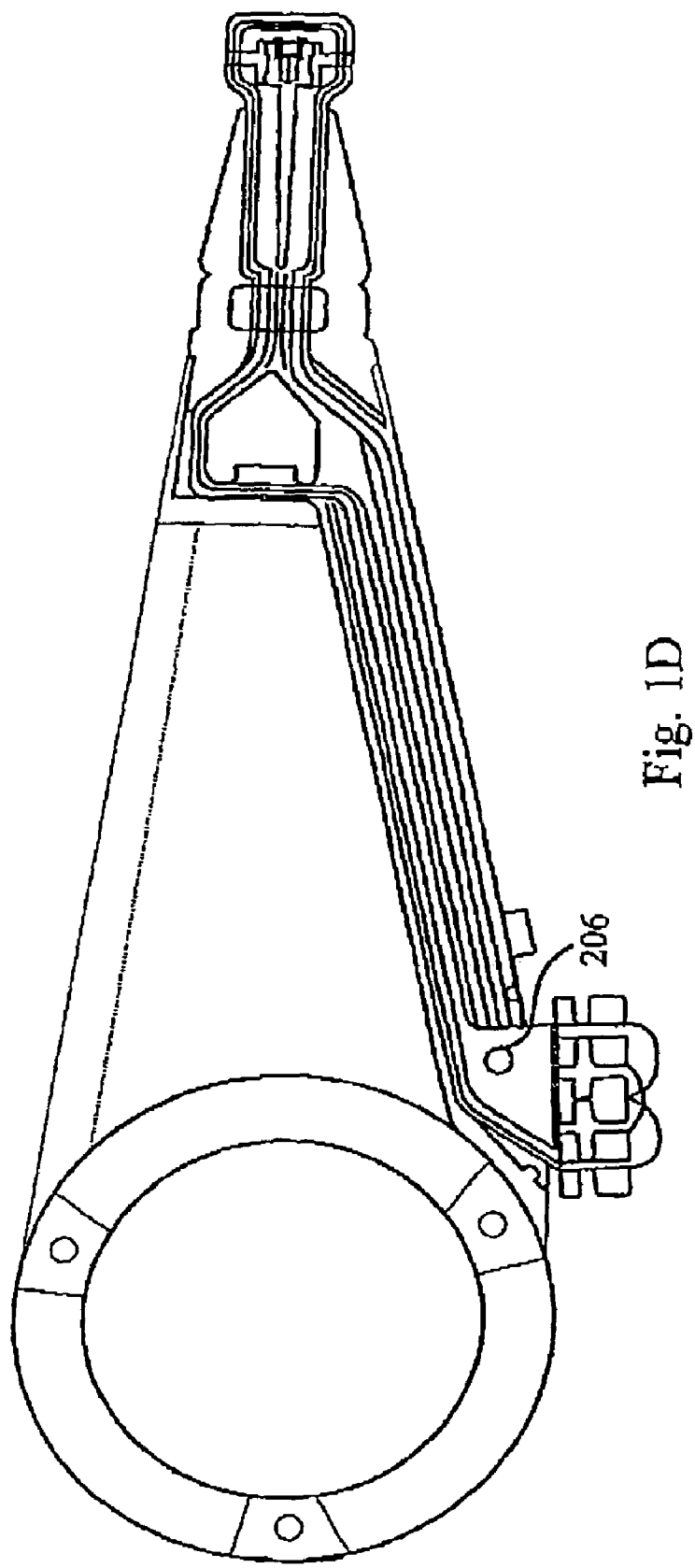
Figure 2E:
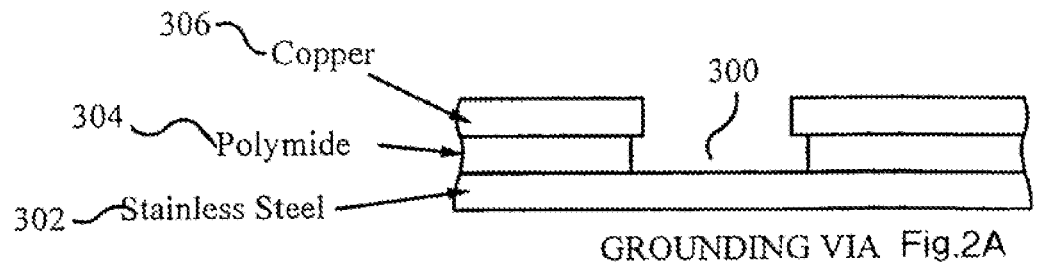
Figure 2E:
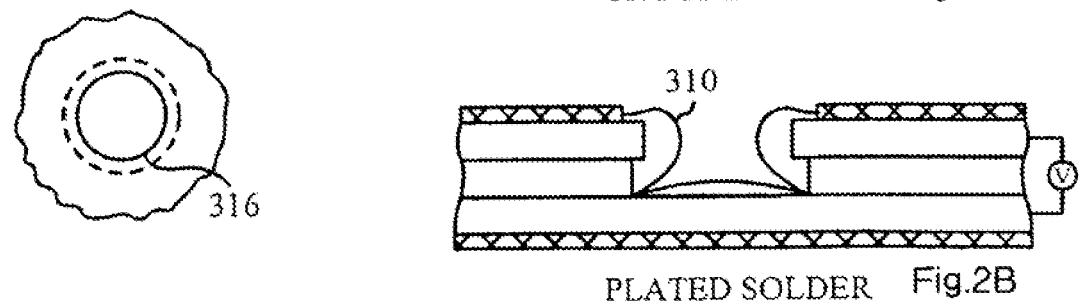
Figure 2E:
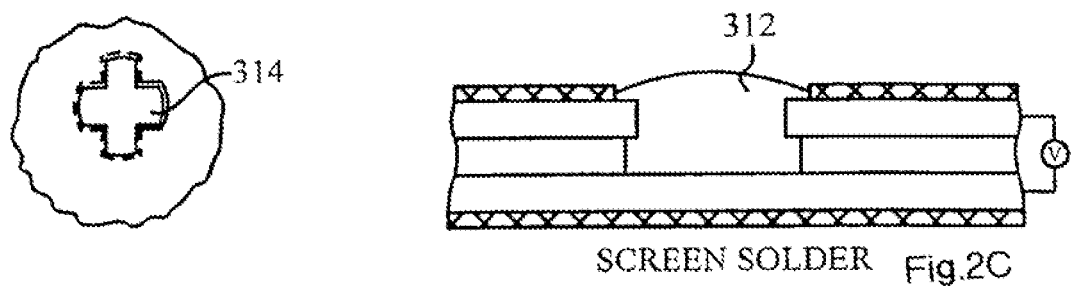
Figure 2E:
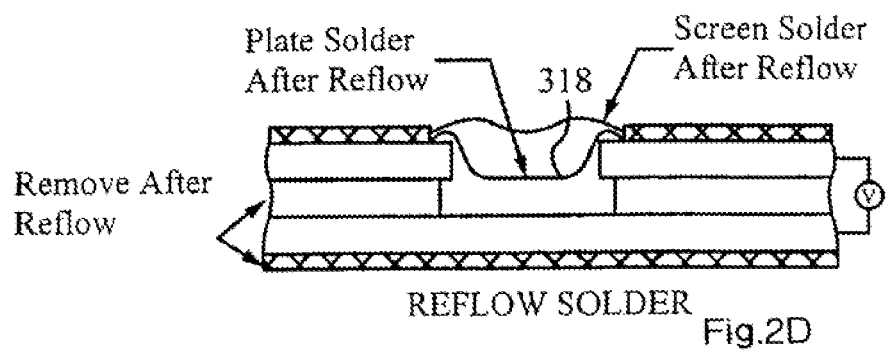
Figure 2E:
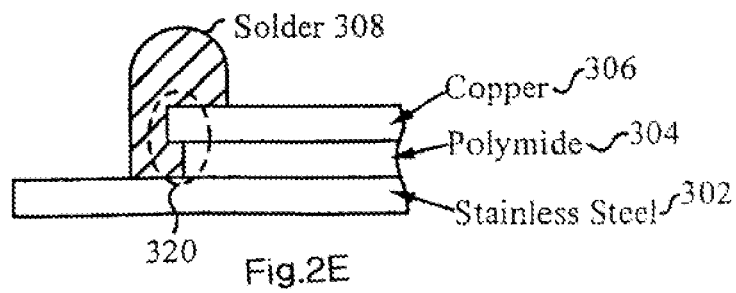

Although the invention is described as embodied in a magnetic disk storage system, the invention also applies to other magnetic recording systems and applications using a sensor to detect a magnetic field, such as magnetic tape recording systems for example.

FIGS. 1A-1D illustrate an ILS with an embodiment of the present invention. A via is created in the ILS through the stainless steel layer 212 at 204, the polymide layer 210 at 202, and the copper layer 208 at 200 that exposes the arm surface. A drop of conductive adhesive is placed in the via to connect the stainless steel layer through the polymide layer to the copper layer and the arm surface.

FIG. 2 illustrates a second embodiment of the present invention. A via 300 is opened in the ILS from the copper layer 306 through the polymide layer 304 to the stainless steel layer 302 or alternatively from the stainless steel layer 302 through the polymide layer 304 to the copper layer 306. This via 300 can be a round shape via 316 or a cross shaped via 314 which provides a larger contact surface for better grounding. Instead of using a drop of conductive adhesive, plated solder 310 or screen solder 312 can be used to connect the stainless steel layer to the copper layer. With either method, the solder is reflowed 318 for increased adhesion to the underlying material. Instead of a via, stepped-back edges 320 can be used. With stepped-back edges, the copper layer 306 or the stainless steel layer 302 and the polymide layer 304 are intentionally stepped back to expose the lower layer. For example, when the copper layer 306 is stepped back, the stainless steel layer 302 is exposed. Solder 308 or conductive adhesive can be applied to over hang the stepped back edge to connect the upper layer with the lower layer.

Figure 3:
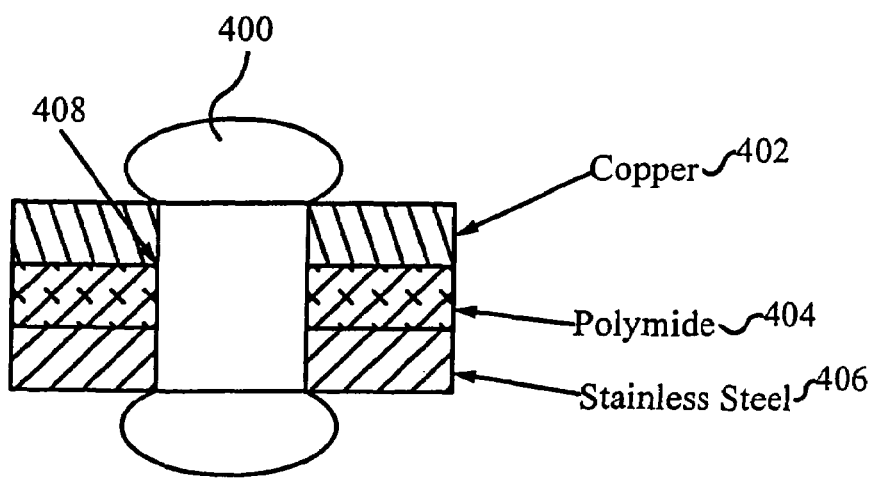
FIG. 3 is an illustration showing the second embodiment of the present invention.

FIG. 3 illustrates another embodiment of the present invention. A through hole 408 is made through the copper layer 402, the polymide layer 404, and the stainless steel layer 406. A rivet 400 is then used to connect the copper layer 402 to the stainless steel layer 406.

Figure 4:
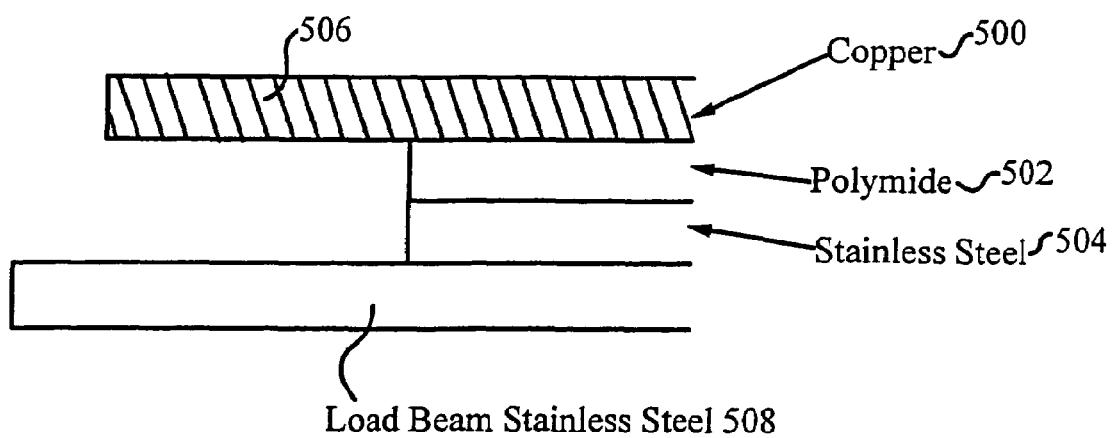
FIG. 4 is an illustration showing the third embodiment of the present invention.

FIG. 4 illustrates another embodiment of the present invention which incorporates other components of the suspension, namely the load beam 508. Connected to the copper layer 500 is a copper finger 506 that overhangs the polymide layer 502, the stainless steel 504 and the load beam 508. This copper finger 506 can be etched from the copper layer 500. The copper finger 506 is pressed and welded into place in contact with the load beam 508. Alternatively, the stainless steel layer 504 is extended so that the copper finger 506 may be pressed onto the stainless steel layer 504 and welded in place.

Figure 5:
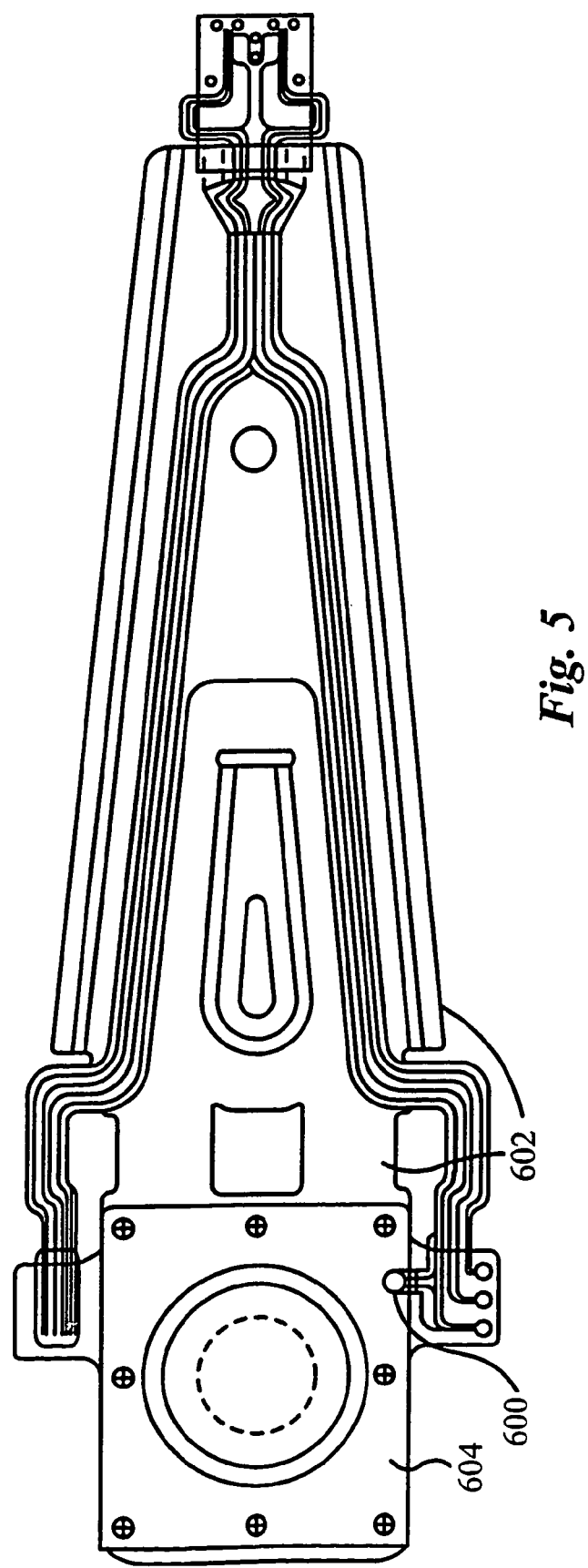
FIG. 5 is an illustration showing the fourth embodiment of the present invention.

FIG. 5 illustrates another embodiment of the present invention. A copper finger is etched from the copper layer as illustrated in the previous embodiment of the present invention. This copper finger is then sandwiched between the mounting plate 604 and the arm during the assembly process. In this illustration, a swage process for a higher level assembly to the arm is shown. This illustration depicts a suspension design that has its load beam integrally manufactured from the ILS steel layer 602. More traditionally and well known in the art is to weld a separate load beam onto the ILS and mount plate 604. In this type of welding process for suspension assembly the copper finger can be sandwiched between the mount plate 604 and the separately fabricated load beam.

Figure 6:
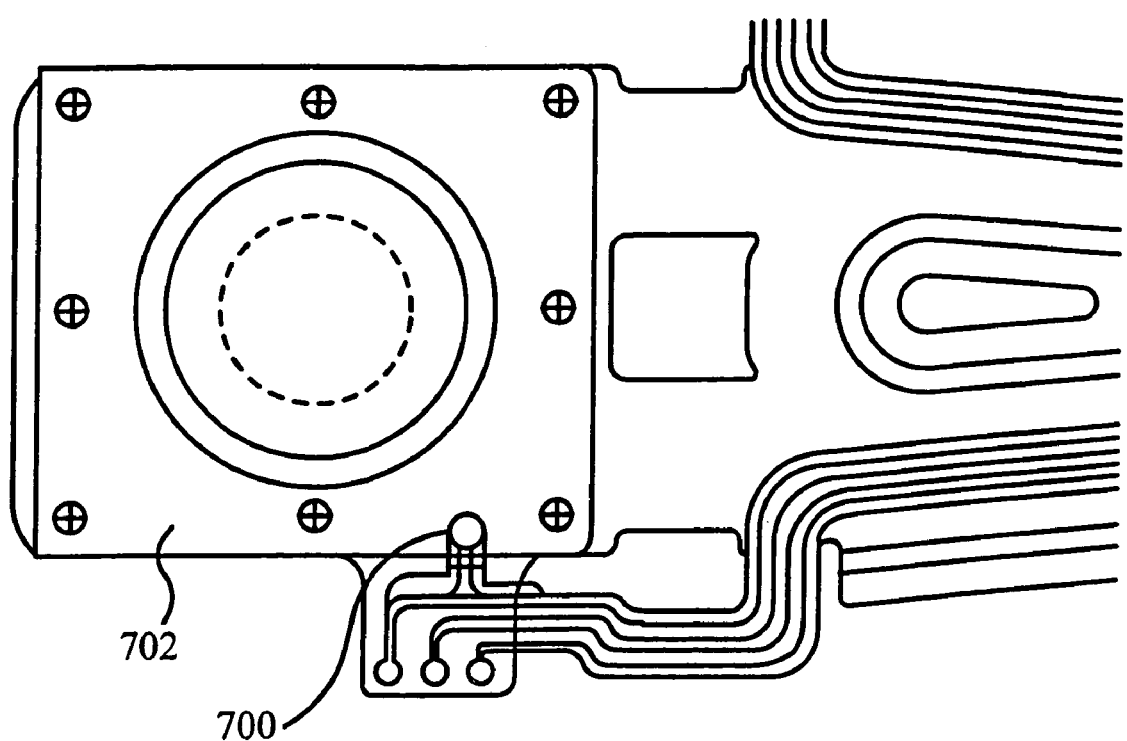
FIG. 6 is an illustration showing the fifth embodiment of the present invention.

FIG. 6 illustrates a close up view of the copper finger 700 in the previous embodiment of the present invention being sandwiched between the mounting plate 702 and the arm during the swage process for higher level of assembly to the arm.

Figure 7:
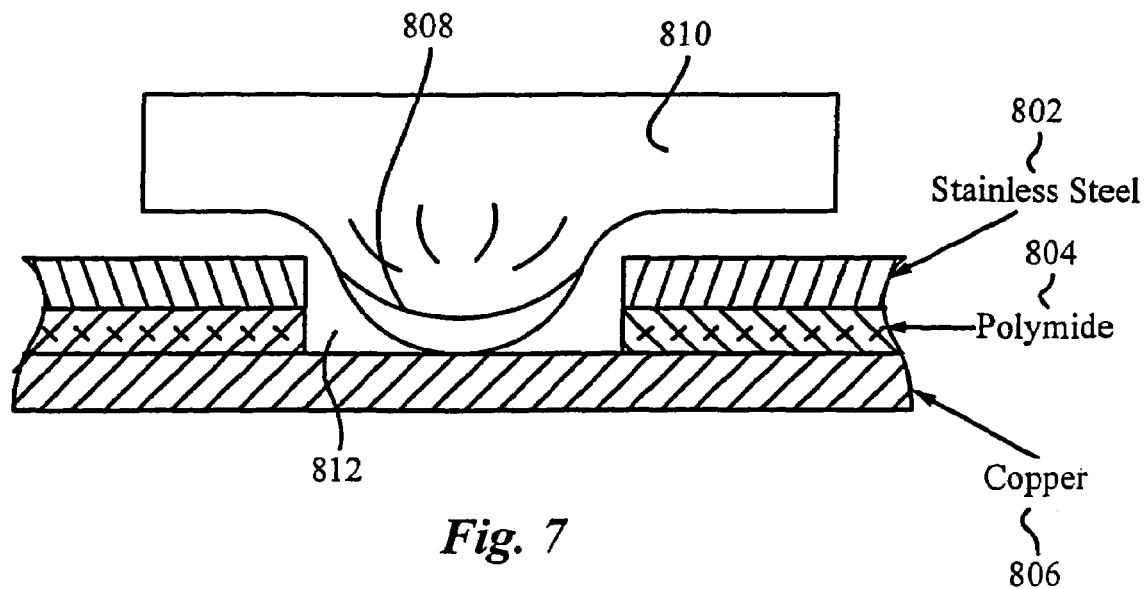
FIG. 7 is an illustration showing a close up view of the fifth embodiment of the present invention.

FIG. 7 illustrates another embodiment of the present invention. A dimple 808 is created on the load beam steel 810. In the ILS, a via 812 is created through the stainless steel layer 802 and the polymide layer 804 exposing the copper layer 806. During assembly, when the load beam and the ILS are assembled, the load beam will be in surface contact with the stainless steel layer of the ILS and the dimple is placed in the via 812 and pressed into contact with the copper layer 806. This will create a grounding path between the stainless steel layer 802 of the ILS and the copper layer 806.

Figure 8:
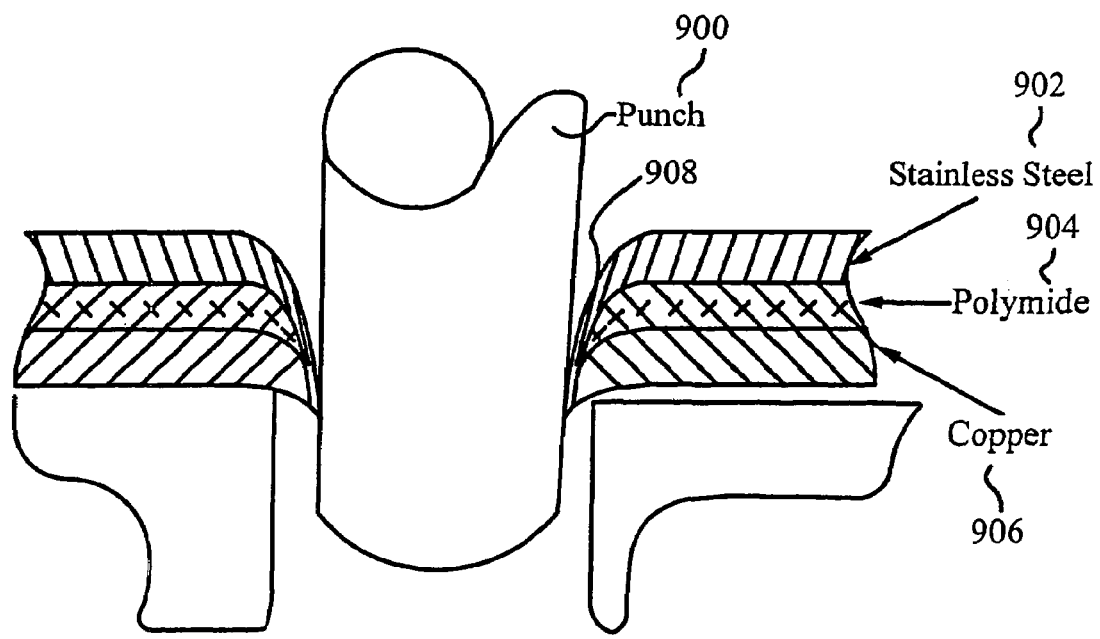
FIG. 8 is an illustration showing the sixth embodiment of the present invention.

FIG. 8 illustrates another embodiment of the present invention. A punch 900 is used to punch a hole through all three layers of the ILS. The copper layer 906 and the stainless steel layer 902 are harder that the polymide layer 904 material and will smear through the polymide layer as illustrated by 908. This will create a grounding path 908 between the copper layer 906 and the stainless steel layer 902.

The above methods illustrates how to create a grounding path between the stainless steel layer and the copper layer of the ILS. The copper layer and in turn the stainless steel layer can be grounded to a controlled ground via a dedicated grounding path etched in the copper layer to a grounding terminal.

The above methods can also be altered to provide methods of creating grounding paths between multiple layers of copper and stainless steel. The top-most conductive layer that is to be connected to the grounding path in a two or more layer structure is herein referred to as the top grounded layer. There may be one or more conductive layers that reside on top of the top grounded layer which is not connected to the grounding path and therefore is not the top grounded layer. Conductive layers below the top grounded layer are referred to as underlying conductive layers.

An integrated lead suspension (ILS) can utilize any of these methods to create a ground path from the stainless steel layer to the copper layer, which can then be ground to a controlled ground potential.

Figure 9:
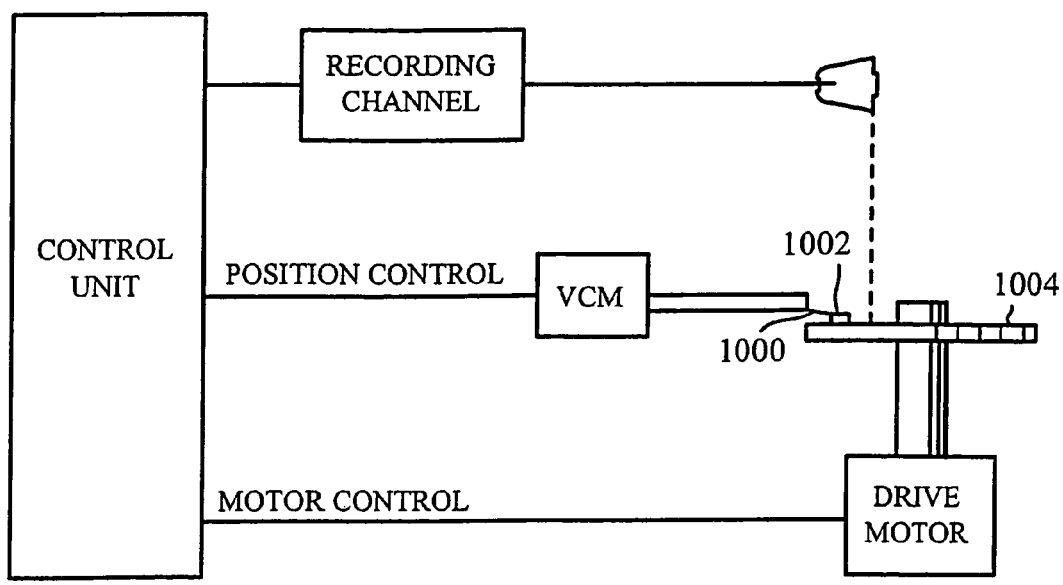
FIG. 9 is an illustration showing the seventh embodiment of the present invention.

A hard drive shown in FIG. 9 which contains a magnetic disk 1004, a read/write head 1002, can also contain an integrated lead suspension 1000 with a grounding path between the stainless steel layer and the copper layer manufactured using any of these methods.

It will be clear to one skilled in the art that the above embodiment may be altered in many ways without departing from the scope of the invention. Accordingly, the scope of the invention should be determined by the following claims and their legal equivalents.

What is claimed is:

1. A method of creating a conductive path between two or more conductive layers, wherein the conductive layers are separated by one or more dielectric layers, the method comprising:
   forming the dielectric layer with a stepped back edge;
   forming a first one of the conductive layers with a stepped back edge that overhangs the stepped back edge of the dielectric layer, wherein the forming of stepped back edges of the dielectric layer and the first conductive layer exposes a surface of a second conductive layer;
   applying a conductive material to the first conductive layer and the exposed portion of the second conductive layer, the conductive material creating an electrical coupling between the first and second conductive layers; and
   grounding at least one of the conductive layers to a controlled ground potential.

2. The method as recited in claim 1, wherein a material of one or more of the conductive layers is copper and a material of one or more of the conductive layers is stainless steel.

3. The method as recited in claim 1, wherein the conductive material is a conductive adhesive.

4. The method as recited in claim 1, wherein one or more of the conductive layers is grounded to the controlled ground potential using one or more dedicated ground paths etched from one or more of the conductive layers.

5. The method as recited in claim 1, wherein the conductive material is plated solder.

6. The method as recited in claim 1, wherein the conductive material is screen solder.

7. The method as recited in claim 1, wherein the conductive material is solder, and further comprising reflowing the solder.

8. The method as recited in claim 1, wherein the conductive layers form part of a lead suspension for suspending an electronic component.

9. The method as recited in claim 8, wherein the electronic component is a magnetic head.

10. The method as recited in claim 1, wherein the conductive material is a finger formed by etching, the finger being sandwiched between a mount plate and a load beam.

11. The method as recited in claim 10, wherein a material of one or more of the conductive layers is copper and a material of one or more of the conductive layers is stainless steel.

12. The method as recited in claim 10, wherein one or more of the conductive layers is grounded to a controlled ground potential using one or more dedicated ground paths etched from one or more of the conductive layers.

13. The method as recited in claim 10, wherein the finger is welded in place.

14. The method as recited in claim 1, further comprising an extraneous conductive layer, the conductive material being a dimple extending from the extraneous conducive layer and contacting the exposed portions of the conductive layers.

15. The method as recited in claim 14, wherein the dimple extends through a via in at least one of the conductive layers.

16. The method as recited in claim 14, wherein a material of one or more of the conductive layers is copper and a material of one or more of the conductive layer is stainless steel.

17. The method as recited in claim 14, wherein one or more of the conductive layers is grounded to a controlled ground potential using one or more dedicated ground paths etched from one or more of the conductive layers.

18. The method as recited in claim 1, wherein the portions of the conductive layers are exposed by punching a hole through the conductive layers, the conductive material extending through the hole.

19. The method as recited in claim 18, wherein a material of one or more of the conductive layers is copper and a material of one or more of the conductive layers is stainless steel.

20. The method as recited in claim 18, wherein one or more of the conductive layers is grounded to a controlled ground potential using one or more dedicated ground paths etched from one or more of the conductive layers.

21. A method as in claim 1 wherein the conductive material extends under the overhanging edge of the first conductive layer.

* * * * *